US012575113B2

(12) United States Patent
Wu et al.

(10) Patent No.: US 12,575,113 B2
(45) Date of Patent: Mar. 10, 2026

(54) HIGH DENSITY MEMORY WITH STACKED NANOSHEET TRANSISTORS

(71) Applicant: International Business Machines Corporation, Armonk, NY (US)

(72) Inventors: Heng Wu, Guilderland, NY (US); Tenko Yamashita, Schenectady, NY (US); Sanjay C. Mehta, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 672 days.

(21) Appl. No.: 17/705,320

(22) Filed: Mar. 26, 2022

(65) Prior Publication Data

US 2023/0309324 A1     Sep. 28, 2023

(51) Int. Cl.
*H10B 63/00*          (2023.01)

(52) U.S. Cl.
CPC .................................. *H10B 63/30* (2023.02)

(58) Field of Classification Search
CPC ... H10B 63/30; H10B 63/84; H01L 29/78696; H01L 29/78621; H01L 29/42392
See application file for complete search history.

(56) References Cited

U.S. PATENT DOCUMENTS 10,453,850 B2    10/2019  Smith 10,833,078 B2    11/2020  Smith
2012/0002461 A1*  1/2012  Karpov .............. G11C 13/0007
                                                              365/158
2015/0179705 A1   6/2015  Wouters et al.
(Continued)

FOREIGN PATENT DOCUMENTS

CN        112909015 A      6/2021
CN        113284908 A      8/2021
(Continued)

OTHER PUBLICATIONS

H. Tanaka et al., "Bit Cost Scalable Technology with Punch and Plug Process for Ultra High Density Flash Memory," 2007 IEEE Symposium on VLSI Technology, Kyoto, Japan, 2007, pp. 14-15, doi: 10.1109/VLSIT.2007.4339708. (Year: 2007).*
(Continued)

*Primary Examiner* — Chad M Dicke
*Assistant Examiner* — Jeremy Daniel Watts
(74) *Attorney, Agent, or Firm* — L. Jeffrey Kelly; Otterstedt & Kammer PLLC

(57)                    ABSTRACT

A high density memory apparatus includes a plurality of transistors vertically stacked on top of each other. The plurality of transistors share a common source structure, but each of the plurality of transistors has its own horizontal nanosheet and gate stack that are separate from respective horizontal channel structures and gate stacks of the others of the plurality of transistors. Ends of the nanosheets distal from the gate stacks are doped to act as drains for the transistors. Each of a plurality of two-terminal memory units is electrically connected to the drain end of a corresponding one of the nanosheets. Some embodiments achieve in excess of 5000 memory bits/square micrometer ($\mu m^2$); in some embodiments, in excess of 6000 bits/$\mu m^2$.

15 Claims, 5 Drawing Sheets

100

(56) References Cited

U.S. PATENT DOCUMENTS

| | | | |
|---|---|---|---|
| 2020/0118996 | A1 | 4/2020 | Parikh |
| 2020/0365463 | A1* | 11/2020 | Or-Bach ............. H01L 23/5252 |
| 2020/0365464 | A1 | 11/2020 | Sreenivasan |
| 2021/0111183 | A1 | 4/2021 | Gardner |
| 2021/0111258 | A1 | 4/2021 | Fulford |
| 2021/0159229 | A1* | 5/2021 | Gomes ................. H10D 62/121 |
| 2021/0366985 | A1* | 11/2021 | Lin ........................ H10N 70/20 |
| 2022/0359391 | A1* | 11/2022 | Jhothiraman ....... H01L 23/5283 |

FOREIGN PATENT DOCUMENTS

| | | |
|---|---|---|
| CN | 112490289 A | 8/2022 |
| WO | 2023/186407 A1 | 10/2023 |

OTHER PUBLICATIONS

S. Barraud et al., "3D RRAMs with Gate-All-Around Stacked Nanosheet Transistors for In-Memory-Computing," 2020 IEEE International Electron Devices Meeting (IEDM), Dec. 2020, pp. 29.5.1-29.5.4, doi: 10.1109/EDM13553.2020.9371982. pp. 1-4.
International Searching Authority, "Notification of Transmittal of the International Search Report and the Written Opinion of the International Searching Authority, or Declaration," Patent Cooperation Treaty, May 23, 2023, 12 pages, International Application No. PCT/EP2023/054415.

* cited by examiner

100

300

400

500

HIGH DENSITY MEMORY WITH STACKED NANOSHEET TRANSISTORS

BACKGROUND

The present invention relates to the electrical, electronic, and computer arts, and more specifically, to fabrication of high density non-volatile memory.

Currently, skilled workers design electronic non-volatile memory (eNVM) devices that include one or more transistors connected with one or more memory cells. In current eNVM design, 1T1R (one transistor—one resistor) layout occupies a significant amount of area, which limits the achievable memory size. In some instances, transistors are stacked on each other. Existing stacked transistors typically share a common gate, i.e. multiple connections between distinct sources and drains are simultaneously controlled by a single gate signal. Existing stacked transistors typically take up a rectangular footprint in chip layouts.

SUMMARY

Principles of the invention provide techniques for high density memory with stacked nanosheet transistors.

In one aspect, an exemplary high density memory apparatus includes a plurality of transistors vertically stacked on top of each other. The plurality of transistors share a common source structure, but each of the plurality of transistors has its own horizontal nanosheet and gate stack that are separate from respective horizontal channel structures and gate stacks of the others of the plurality of transistors. Ends of the nanosheets, distal from the gate stacks and common source, are doped to act as drains for the transistors. Each of a plurality of two-terminal memory units is electrically connected to the drain end of a corresponding one of the nanosheets.

In another aspect, a high density transistor apparatus has a plurality of transistors vertically stacked on top of each other. The plurality of transistors share a common source structure. Each of the plurality of transistors has its own horizontal nanosheet and gate stack that are separate from the others of the plurality of transistors. Each nanosheet protrudes in a horizontal first direction from the common source structure through its corresponding gate to a corresponding drain end. From bottom to top of the stack of transistors, a metal portion of each lower gate stack protrudes from its corresponding nanosheet, in a horizontal second direction that is crosswise to the first direction, further than a metal portion of a next higher gate stack, so that a top gate metal is shorter than a bottom gate metal and so that gate contact vias of the plurality of transistors are horizontally offset from each other in the second direction along the lengths of the gate metals.

According to another aspect, a high density transistor apparatus has a plurality of transistors vertically stacked on top of each other. The plurality of transistors share a common source structure. Each of the plurality of transistors has its own horizontal nanosheet and gate stack that are separate from the others of the plurality of transistor. Each nanosheet protrudes in a horizontal first direction from the common source structure through its corresponding gate to its corresponding drain end. From top to bottom of the stack of transistors, each nanosheet protrudes further than a next higher nanosheet from its corresponding gate stack, in the first direction, so that the top nanosheet is shorter than the bottom nanosheet and so that drain ends of the plurality of nanosheets are horizontally offset from each other in the first direction along the lengths of the nanosheets.

In view of the foregoing, techniques of the present invention can provide substantial beneficial technical effects. For example, one or more embodiments provide one or more of:

Vertically stacked nanosheet transistors with separated gates used as the drive transistors for eNVM devices. Vertically stacking drive transistors reduces footprint area.

The stacked nanosheet transistors have staircase shape gates and drains design for contact via landing and memory units connections.

By stacking nanosheets vertically, a high density of eNVM cells can be realized.

Higher densities of non-volatile memory in chip layouts.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

As mentioned, existing memory layouts occupy all of a generally rectangular footprint area for each unit of memory. Advantageously, according to exemplary embodiments, high density memory can be fabricated to occupy a footprint smaller than conventional layouts achieve. This is accomplished by laying out the memory in a stacked configuration, where multiple memory units are written to, and read from, using discrete transistors that are vertically layered on top of each other, each transistor having its own gate. In one or more embodiments, the invention further economizes area by having an orthogonal layout, in which gate metals and nanosheets of the plurality of transistors protrude at right angles to each other from a corner of the layout. In one or more embodiments, the stacked memory units are arranged vertically above the drains of the transistors.

Figure 1:
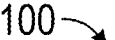
FIG. 1 depicts in a schematic a high density memory apparatus, according to exemplary embodiments.
Figure 1:
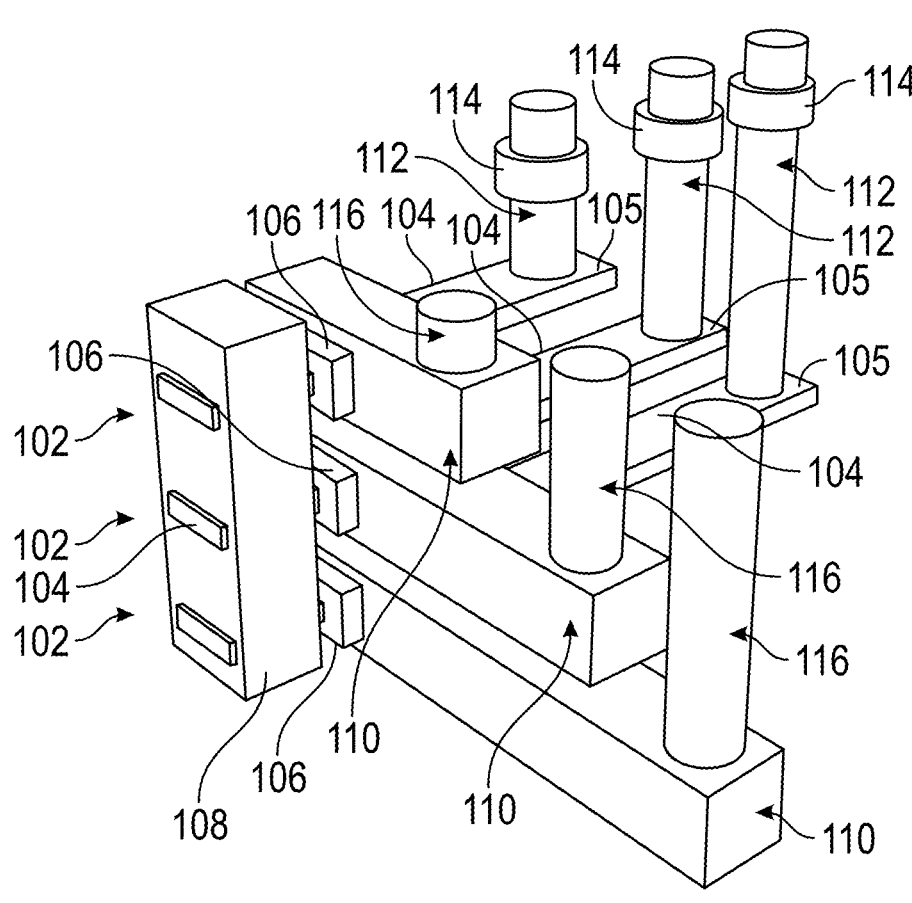

For example, FIG. 1 depicts a high density memory apparatus 100 that includes a plurality of transistors 102, which are stacked atop each other. Each of the transistors 102 has a nanosheet 104 and a gate stack 106 that surrounds its nanosheet. In one or more embodiments, each nanosheet is on the order of 3 nanometers thick and no more than 20 nm wide. In one or more embodiments, the nanosheets may be between 3 and 10 nm thick, and between 5 and 50 nm wide. In one or more embodiments, each gate stack 106 is no less than 10 nm tall. In one or more embodiments, each gate stack 106 is no less than 30 nm wide. The nanosheets may be spaced apart by 8 to 15 nm separation, for example.

The nanosheets 104 protrude from a common source structure 108 through the gate stacks 106 in a first horizontal direction. The transistors 102, each of which comprises one of the nanosheets 104 and a corresponding one of the gate stacks 106, share the common source structure 108. In one or more embodiments, the source structure is on the order of 20 nm tall and no less than 5 nm wide. Gate metal 110 protrudes from each of the gate stacks 106 in a second horizontal direction, crosswise to the lengths of the nanosheets 104. For clarity of illustration, dielectric layers that isolate the various active components are not shown in FIG. 1.

Figure 8:
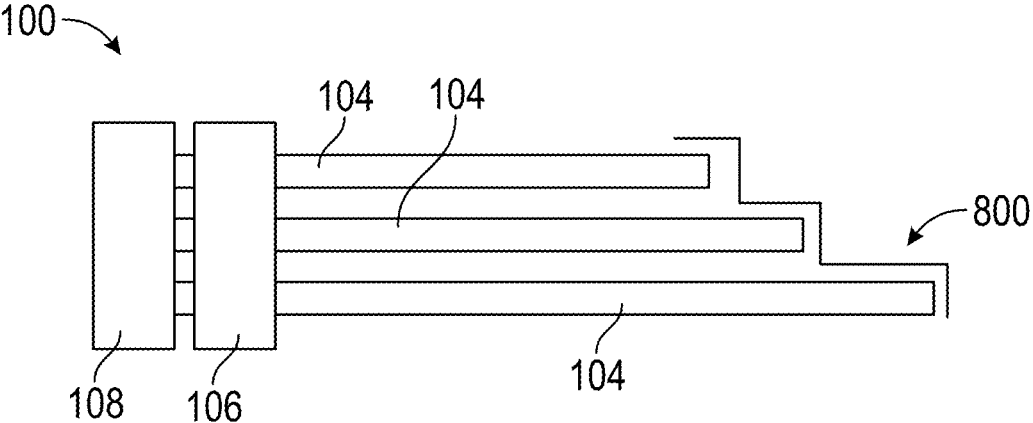
FIG. 8 depicts in a side view a staircase arrangement of nanosheets protruding horizontally from gate stacks, according to exemplary embodiments.

Ends 105 of the nanosheets 104, away from the gate stacks 106, are doped to act as drains for the transistors 102. in one or more embodiments, n-type doping (e.g., As or P) is used. In one or more embodiments, the doping level is between about 1e20 to about 1e21 atoms/cm$^3$. The ends 105 of the nanosheets 104 are arranged in a "staircase" substantially as shown by the outline 800 in FIG. 8. In this context, "staircase" means that the bottom nanosheet has a length of L, the next-from-the-bottom nanosheet has a length of L-S, and the offsets between ends of the nanosheets continue all the way up to the top nanosheet. Advantageously, this structure enables attaching drain contact vias 112 to the drain ends 105 of the nanosheets 104 without shorts between adjacent vias. In one or more embodiments, an offset from each drain end to the next drain end is between about 20 nm to about 30 nm. Thus, in one or more embodiments, from top to bottom of the staircase, each nanosheet 104 protrudes no less than 20 nm further and as much as 50 nm further from the gate stacks 106, compared to a next higher nanosheet structure. In one or more embodiments, the different nanosheets may have different offsets from each other (i.e., the value of S is not necessarily the same for each "step" in the "staircase," although it can be). In one or more embodiments, the shortest nanosheet structure protrudes at least 30 nm beyond its corresponding gate stack. Discrete drain vias 112, each of which connects the drain end 105 of a corresponding one of the nanosheets 104 to a corresponding memory unit 114, protrude upward from the staggered ends of the nanosheets. Any two-terminal memory units 114 can be used in one or more embodiments of the invention. In one or more embodiments, resistive memory units are used, e.g., ovonic threshold switches.

Ends of the gate metal 110, away from the gate stacks 106, also form a staircase, from which gate contact vias 116 protrude upward. In one or more embodiments, from bottom to top of the staircase, each gate metal 110 protrudes no less than 20 nm further and as much as 50 nm further from the gate stacks 106, compared to a next higher gate metal.

An aspect of the invention is that, in one or more embodiments, the nanosheets extend crosswise to the gate metal so as to form an overall "L" shaped footprint. In one or more embodiments, the nanosheets extend perpendicularly to the gate metal. Advantageously, because of the L-shaped footprint, it is possible to fit a high density memory apparatus into half of the generally rectangular footprint for a conventional memory apparatus. Effectively, using high density memory apparatus, according to exemplary embodiments, can double or triple the density of memory devices on a chip. It is expected that embodiments of the invention can achieve in excess of 5000 memory bits/square micrometer ($\mu m^2$); in one or more embodiments, in excess of 6000 bits/$\mu m^2$.

Figure 2:
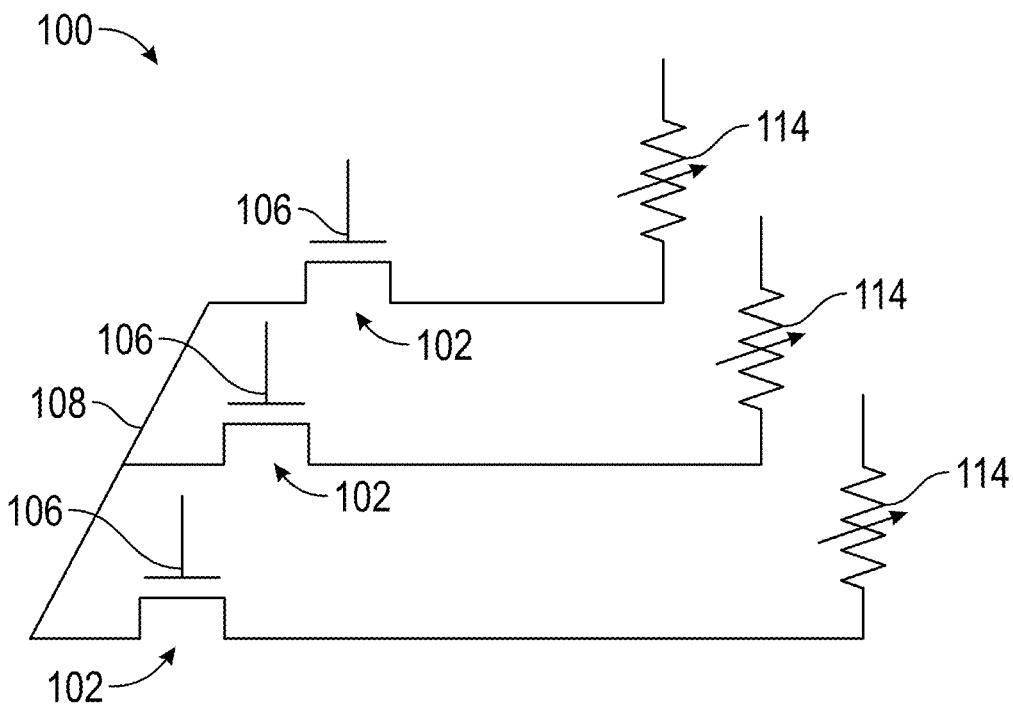
FIG. 2 depicts in a schematic a circuit formed by the high density memory apparatus of FIG. 1.

Another aspect of the structure 100 is that, as shown in FIG. 2, each of the transistors 102 has a discrete gate stack 106 so that the several memory units 114 can be separately written to and read from. Although for ease of illustration only three transistors and memory units are shown, in actuality, a larger number of transistors and memory units could be provided. A skilled worker will appreciate that the lengths of gate contact vias 116 will affect latency of the device, and will take this into account when designing for various applications.

In one or more embodiments, the source structure 108 can be formed from a semiconductor material that is appropriately doped, e.g., a p-doped silicon or silicon-germanium for a PFET or an n-doped silicon or silicon-germanium for an NFET.

In one or more embodiments, the source structure, and the nanosheets 104, are epitaxially formed.

"Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

In one or more embodiments, the gate stacks 106 comprise gate metal surrounded by high-k dielectric. Gate stacks in both nFET and pFET structures (in embodiments having both types of regions) include work function material (WFM) layers. Non-limiting examples of suitable work function (gate) metals include p-type work function materials and n-type work function materials. P-type work function materials include compositions such as ruthenium, palladium, platinum, cobalt, nickel, and conductive metal nitride like TiN, WN, or any combination thereof. N-type work function materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function material(s) may be deposited by a suitable deposition process, for example, ALD, CVD, PECVD, PVD, plating, and thermal or e-beam evaporation. The skilled worker will appreciate that pinch-off of work function material between semiconductor fins preferably is avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. A skilled worker is familiar with work functions and with the sensitivity of threshold voltage (Vt) of nFET devices to the thickness of work function materials (such as titanium nitride (TiN), and will accordingly select an appropriate work function material.

High-k dielectrics include hafnium oxide (HfO), zirconium oxide (ZrO), or titanium oxide (TiO) with k on the order of 3-15 times higher than silicon dioxide (SiO2), e.g., on the order of 10-50, or similar suitable materials. Generally, oxides of refractory metals provide high-k dielectrics.

Figure 3:
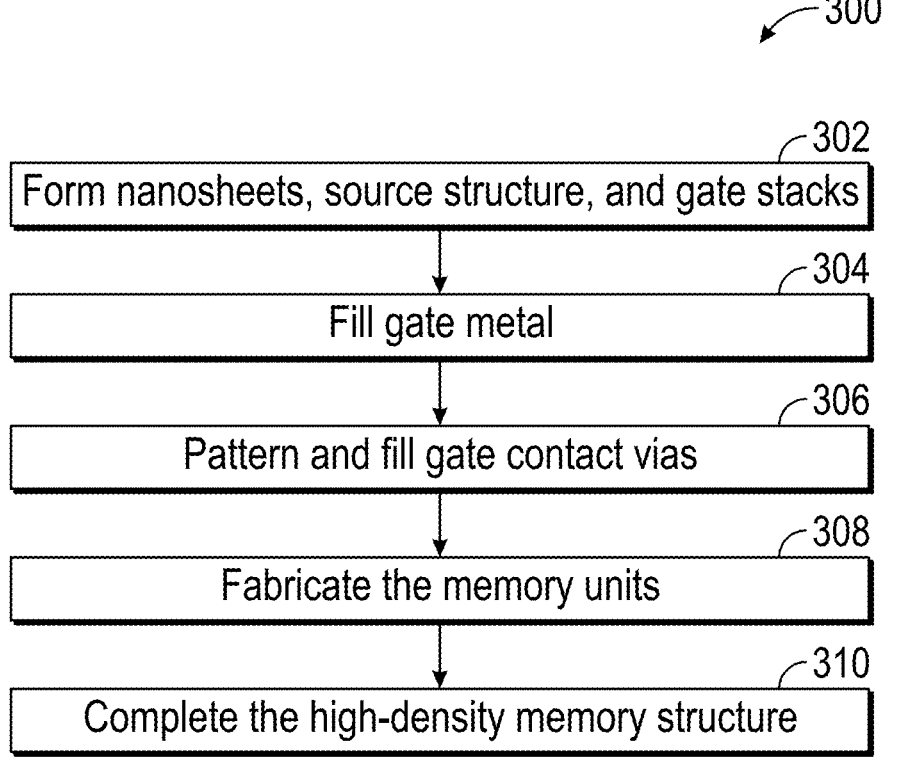
FIG. 3 depicts in a flow chart steps of a method for making the apparatus of FIG. 1, according to exemplary embodiments.

FIG. 3 depicts in a flow chart steps of a method 300 for making the apparatus of FIG. 1, according to exemplary embodiments. FIG. 4 through FIG. 7 depict in schematics a sequence of intermediate structures 400, 500, 600, 700 that are formed according to steps of FIG. 3. For clarity of illustration, dielectric layers that isolate the various active components are not shown in FIG. 4 through FIG. 7.

Figure 4:
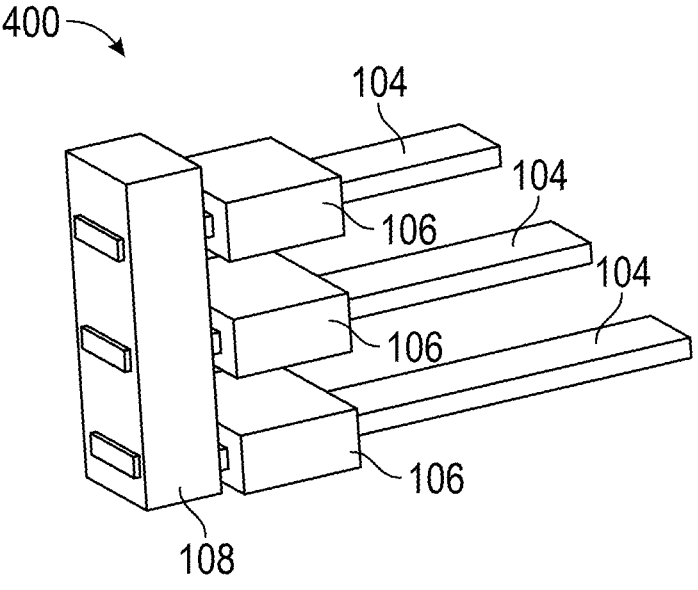
FIG. 4 through FIG. 7 depict in schematics a sequence of intermediate structures formed according to steps of FIG. 3.
Figure 5:
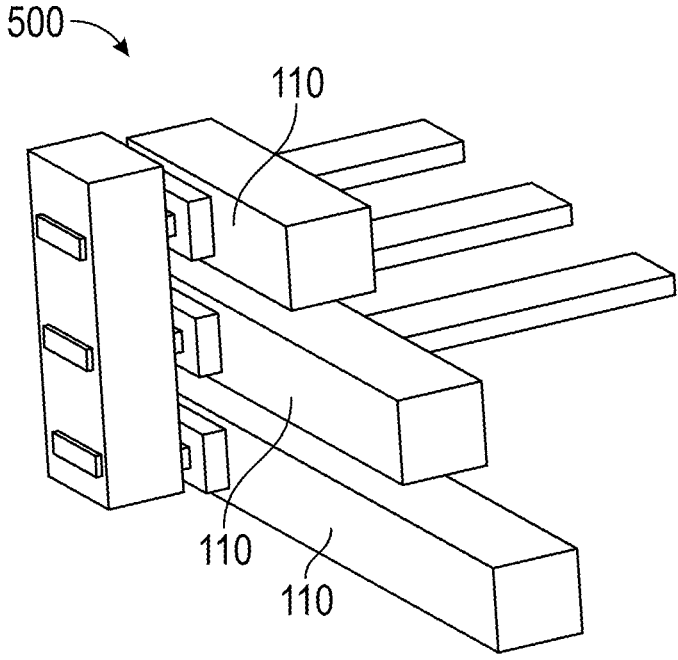
Figure 6:
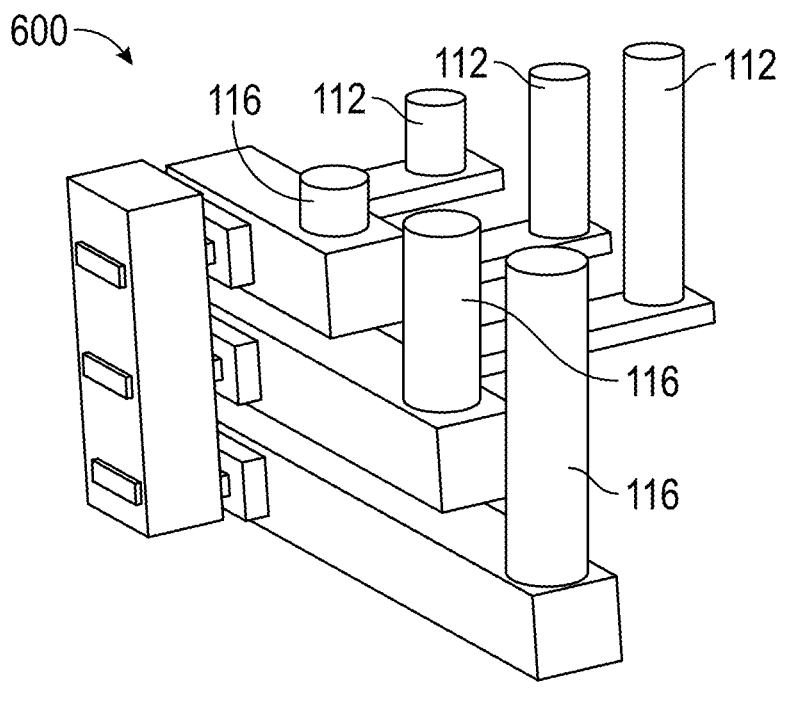
Figure 7:
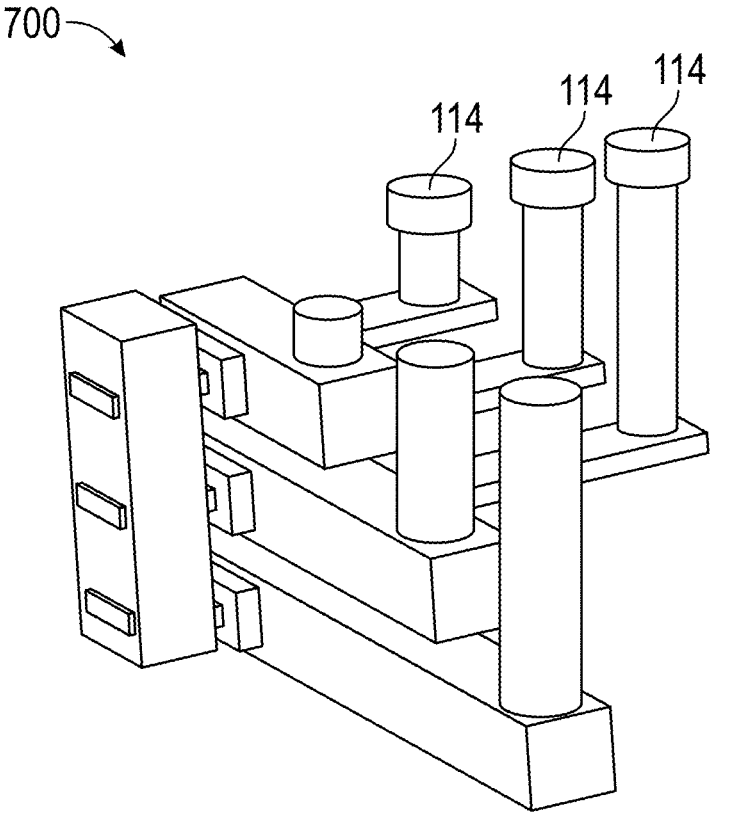

Referring to FIG. 3, at 302, form nanosheets 104, source structure 108, and gate stacks 106 to complete the intermediate structure 400 (as shown in FIG. 4). In one or more embodiments, the distal or drain ends of the nanosheets 104 are n-doped, e.g., As or P doped, to a level of 1e20 to 1e21 atoms/cm$^3$. At 304, fill gate metal 110 to complete the intermediate structure 500 (as shown in FIG. 5). At 306, pattern and fill the drain contact vias 112 and gate contact vias 116 with conductive material (e.g., tungsten or titanium nitride) so as to complete the intermediate structure 600 (as shown in FIG. 6). At 308, fabricate the memory units 114 to complete the intermediate structure 700 (as shown in FIG. 7). At 310, complete the high-density memory structure 100 (as shown in FIG. 1).

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching." For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth and so on. Terms such as "high-K" and "low-K" have definite meanings to the skilled artisan and are not mere relative terms. Moreover, one or more of the processing steps and tooling used to fabricate semiconductor devices are also described in a number of readily available publications, including, for example: James D. Plummer et al., *Silicon VLSI Technology: Fundamentals, Practice, and Modeling 1$^{st}$ Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, according to one aspect of the invention, an exemplary high density memory apparatus 100 includes a plurality of transistors 102 vertically stacked on top of each other. The plurality of transistors share a common source structure 108, but each of the plurality of transistors has its own horizontal nanosheet 104 and gate stack 106 that are separate from respective horizontal channel structures and gate stacks of the others of the plurality of transistors. Ends 105 of the nanosheets that are distal from the gate stacks are doped to act as drains for the transistors. Each of a plurality of two-terminal memory units 114 is electrically connected to the drain end of a corresponding one of the nanosheets.

In another aspect, a high density transistor apparatus 100 has a plurality of transistors 102 vertically stacked on top of each other. The plurality of transistors share a common source structure 108. Each of the plurality of transistors has its own horizontal nanosheet 104 and gate stack 106 that are separate from the others of the plurality of transistors. Each nanosheet protrudes in a horizontal first direction from the common source structure through its corresponding gate to a corresponding distal end 105 that is doped to act as a drain. From bottom to top of the stack of transistors, a metal portion 110 of each lower gate stack (see discussion of gate metal above) protrudes from its corresponding nanosheet, in a horizontal second direction that is crosswise to the first direction, further than a metal portion of a next higher gate stack, so that a top gate metal is shorter than a bottom gate metal and so that gate contact vias 116 of the plurality of transistors are horizontally offset from each other in the second direction along the lengths of the gate metals. In one or more embodiments, each gate metal protrudes no less than 20 nm further from the gate stacks, compared to a next higher gate metal. In one or more embodiments, each gate metal protrudes no more than 50 nm further from the gate stacks, compared to the next higher gate metal.

In one or more embodiments, each nanosheet protrudes in a horizontal first direction from the common source structure through its corresponding gate to its drain end (an end of the nanosheet that is doped to act as a drain); and from bottom to top of the stack of transistors, each lower nanosheet protrudes further in the first direction from its corresponding gate stack, compared to a next higher nanosheet, so that the bottom nanosheet is longer than the top nanosheet and the drain ends of the plurality of nanosheets are horizontally offset from each other in the first direction. In one or more embodiments, each nanosheet protrudes no less than 20 nm further from the gate stacks, compared to a next higher nanosheet structure. In one or more embodiments, each nanosheet protrudes no more than 50 nm further from the gate stacks, compared to the next higher nanosheet structure.

In one or more embodiments, lengths of the nanosheets and the gate metals are such as to achieve in excess of 5000 memory bits/square micrometer ($\mu m^2$). In one or more embodiments, lengths of the nanosheets and the gate metals are such as to achieve in excess of 6000 bits/$\mu m^2$.

According to another aspect, a high density transistor apparatus has a plurality of transistors vertically stacked on top of each other. The plurality of transistors share a common source structure. Each of the plurality of transistors has its own horizontal nanosheet and gate stack that are separate from the others of the plurality of transistor. Each nanosheet protrudes in a horizontal first direction from the common source structure through its corresponding gate to its corresponding drain end. From top to bottom of the stack of transistors, each nanosheet protrudes further than a next higher nanosheet from its corresponding gate stack, in the first direction, so that the top nanosheet is shorter than the bottom nanosheet and so that drain ends of the plurality of nanosheets are horizontally offset from each other in the first direction along the lengths of the nanosheets.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A high density memory apparatus, comprising:
   a plurality of transistors vertically stacked on top of each other, wherein:
   the plurality of transistors share a common source structure;
   each of the plurality of transistors comprises its own horizontal nanosheet, and gate stack that are separate from respective horizontal channel structures and gate stacks of others of the plurality of transistors; and
   drain ends of the nanosheets that are distal from the gate stacks are doped to act as drains for the transistors; and
   a plurality of two-terminal memory units, each of which is electrically connected vertically above the drain end of a corresponding one of the nanosheets by a drain contact via;
   wherein:
   each nanosheet protrudes in a horizontal first direction from the common source structure through its corresponding gate to its drain end;
   from top to bottom of the stack of transistors, a metal portion of each gate stack protrudes from its corresponding nanosheet, in a horizontal second direction that is crosswise to the first direction, further than a metal portion of a next higher gate stack, so that a top gate metal is shorter than a bottom gate metal and so that gate contact vias of the plurality of transistors are horizontally offset from each other in the second direction along the lengths of the gate metals; and
   from bottom to top of the stack of transistors, each lower nanosheet protrudes further in the first direction from its corresponding gate stack, compared to a next higher nanosheet, so that a bottom nanosheet is longer than a top nanosheet and the drain ends of the nanosheets are horizontally offset from each other in the first direction; and
   wherein each gate metal protrudes no less than 20 nm further from the gate stacks, compared to a next higher gate metal.

2. The apparatus of claim 1, wherein each gate metal protrudes no more than 50 nm further from the gate stacks, compared to the next higher gate metal.

3. The apparatus of claim 1, wherein the two-terminal memory units comprise resistive memory units.

4. The apparatus of claim 3, wherein the resistive memory units comprise ovonic threshold switches.

5. A high density memory apparatus, comprising:
   a plurality of transistors vertically stacked on top of each other, wherein:
   the plurality of transistors share a common source structure;
   each of the plurality of transistors comprises its own horizontal nanosheet, and gate stack that are separate from respective horizontal channel structures and gate stacks of others of the plurality of transistors; and drain ends of the nanosheets that are distal from the gate stacks are doped to act as drains for the transistors; and a plurality of two-terminal memory units, each of which is electrically connected vertically above the drain end of a corresponding one of the nanosheets by a drain contact via;

wherein:

each nanosheet protrudes in a horizontal first direction from the common source structure through its corresponding gate to its drain end;

from top to bottom of the stack of transistors, a metal portion of each gate stack protrudes from its corresponding nanosheet, in a horizontal second direction that is crosswise to the first direction, further than a metal portion of a next higher gate stack, so that a top gate metal is shorter than a bottom gate metal and so that gate contact vias of the plurality of transistors are horizontally offset from each other in the second direction along the lengths of the gate metals; and from bottom to top of the stack of transistors, each lower nanosheet protrudes further in the first direction from its corresponding gate stack, compared to a next higher nanosheet, so that a bottom nanosheet is longer than a top nanosheet and the drain ends of the nanosheets are horizontally offset from each other in the first direction; and wherein each nanosheet protrudes no less than 20 nm further from the gate stacks, compared to a next higher nanosheet structure.

6. The apparatus of claim 5, wherein each nanosheet protrudes no more than 50 nm further from the gate stacks, compared to the next higher nanosheet structure.

7. A high density memory apparatus, comprising:

a plurality of transistors vertically stacked on top of each other, wherein:

the plurality of transistors share a common source structure;

each of the plurality of transistors comprises its own horizontal nanosheet, and gate stack that are separate from respective horizontal channel structures and gate stacks of others of the plurality of transistors; and drain ends of the nanosheets that are distal from the gate stacks are doped to act as drains for the transistors; and a plurality of two-terminal memory units, each of which is electrically connected vertically above the drain end of a corresponding one of the nanosheets by a drain contact via;

wherein:

each nanosheet protrudes in a horizontal first direction from the common source structure through its corresponding gate to its drain end;

from top to bottom of the stack of transistors, a metal portion of each gate stack protrudes from its corresponding nanosheet, in a horizontal second direction that is crosswise to the first direction, further than a metal portion of a next higher gate stack, so that a top gate metal is shorter than a bottom gate metal and so that gate contact vias of the plurality of transistors are horizontally offset from each other in the second direction along the lengths of the gate metals; and from bottom to top of the stack of transistors, each lower nanosheet protrudes further in the first direction from its corresponding gate stack, compared to a next higher nanosheet, so that a bottom nanosheet is longer than a top nanosheet and the drain ends of the nanosheets are horizontally offset from each other in the first direction; and wherein lengths of the nanosheets and the gate metals are such as to achieve in excess of 5000 memory bits/square micrometer ($\mu$m2).

8. The apparatus of claim 7, wherein the lengths of the nanosheets and the gate metals are such as to achieve in excess of 6000 bits/$\mu$m2.

9. A high density transistor apparatus comprising:

a plurality of transistors vertically stacked on top of each other, wherein:

the plurality of transistors share a common source structure;

each of the plurality of transistors comprises its own horizontal nanosheet and gate stack that are separate from others of the plurality of transistors;

each nanosheet protrudes in a horizontal first direction from the common source structure through its corresponding gate to a corresponding drain end that is doped to act as a drain; and from bottom to top of the stack of transistors, a metal portion of each lower gate stack protrudes from its corresponding nanosheet, in a horizontal second direction that is crosswise to the first direction, further than a metal portion of a next higher gate stack, so that a top gate metal is shorter than a bottom gate metal and so that gate contact vias of the plurality of transistors are horizontally offset from each other in the second direction along the lengths of the gate metals;

wherein:

each nanosheet protrudes in a horizontal first direction from the common source structure through its corresponding gate to its drain end;

from bottom to top of the stack of transistors, each lower nanosheet protrudes further in the first direction from its corresponding gate stack, compared to a next higher nanosheet, so that a bottom nanosheet is longer than a top nanosheet and the drain ends of the nanosheets are horizontally offset from each other in the first direction; and each gate metal protrudes no less than 20 nm further from the gate stacks, compared to a next higher gate metal.

10. The apparatus of claim 9, wherein each gate metal protrudes no more than 50 nm further from the gate stacks, compared to the next higher gate metal.

11. The apparatus of claim 9, wherein each nanosheet protrudes no less than 20 nm further from the gate stacks, compared to a next higher nanosheet structure.

12. The apparatus of claim 11, wherein each nanosheet protrudes no more than 50 nm further from the gate stacks, compared to the next higher nanosheet structure.

13. The apparatus of claim 9, wherein lengths of the nanosheets and the gate metals are such as to achieve in excess of 5000 memory bits/square micrometer ($\mu$m2).

14. The apparatus of claim 13, wherein the lengths of the nanosheets and the gate metals are such as to achieve in excess of 6000 bits/$\mu$m2.

15. A high density transistor apparatus, comprising:

a plurality of transistors vertically stacked on top of each other, wherein:

the plurality of transistors share a common source structure;

each of the plurality of transistors comprises its own horizontal nanosheet and gate stack that are separate from others of the plurality of transistors;

each nanosheet protrudes in a horizontal first direction from the common source structure through its corresponding gate to its corresponding drain end that is doped to act as a drain; and from top to bottom of the stack of transistors, each nanosheet protrudes further than a next higher nanosheet from its corresponding gate stack, in the first direction, so that a top nanosheet is shorter than a bottom nanosheet and so that drain ends of the nanosheets are horizontally offset from each other in the first direction along lengths of the nanosheets;

wherein each gate metal protrudes no less than 20 nm further from the gate stacks, and no more than 50 nm further from the gate stacks, compared to a next higher gate metal.

*     *     *     *     *